United States Patent [19]

Fox et al.

[11] Patent Number: 5,592,053
[45] Date of Patent: Jan. 7, 1997

[54] DIAMOND TARGET ELECTRON BEAM DEVICE

[75] Inventors: Bradley A. Fox, Cary; Jeffrey T. Glass, Apex; David L. Driefus, Cary; Luka Lojk, Chapel Hill, all of N.C.

[73] Assignee: Kobe Steel USA, Inc., Research Triangle Park, N.C.

[21] Appl. No.: 349,794

[22] Filed: Dec. 6, 1994

[51] Int. Cl.$^6$ .............................. H03F 3/54; H01J 25/00
[52] U.S. Cl. .............................. 315/3; 330/44; 315/169.1
[58] Field of Search ................................ 313/495–497; 330/44–46; 315/39.57, 349, 169.1

[56] References Cited

U.S. PATENT DOCUMENTS

| | | | |
|---|---|---|---|
| 3,725,803 | 4/1973 | Yoder | 315/3 X |
| 3,922,616 | 11/1975 | Weiner | 330/44 |
| 4,084,942 | 4/1978 | Villalobos | 51/307 |
| 4,164,680 | 8/1979 | Villalobos | 313/336 |
| 4,168,213 | 9/1979 | Hoeberechts | 204/15 |
| 4,410,832 | 10/1983 | Smith et al. | 315/3 |
| 4,990,766 | 2/1991 | Simms et al. | 250/213 VT |
| 4,993,033 | 2/1991 | Lin | 372/30 |
| 5,129,850 | 7/1992 | Kane et al. | 445/24 |
| 5,132,585 | 7/1992 | Kane et al. | 313/44 |
| 5,138,237 | 8/1992 | Kane et al. | 315/349 |
| 5,141,460 | 8/1992 | Jaskie et al. | 445/24 |
| 5,180,951 | 1/1993 | Dworsky et al. | 315/169 |
| 5,199,918 | 4/1993 | Kumar | 445/50 |
| 5,202,571 | 4/1993 | Hirabayashi et al. | 257/10 |
| 5,203,731 | 4/1993 | Zimmerman | 445/24 |
| 5,252,833 | 10/1993 | Kane et al. | 250/423 |
| 5,252,840 | 10/1993 | Shiomi et al. | 257/77 |
| 5,256,888 | 10/1993 | Kane | 257/77 |
| 5,258,685 | 11/1993 | Jaskie et al. | 313/309 |
| 5,268,648 | 12/1993 | Calcatera | 330/3 |
| 5,278,475 | 1/1994 | Jaskie et al. | 315/169.3 |
| 5,283,501 | 2/1994 | Zhu et al. | 315/169.3 |
| 5,285,084 | 2/1994 | Von Windheim | 257/77 |
| 5,285,089 | 2/1994 | Das | 257/197 |
| 5,289,086 | 2/1994 | Kane | 315/349 |
| 5,290,610 | 3/1994 | Kane et al. | 427/577 |
| 5,298,766 | 3/1994 | Kobashi et al. | 257/77 |
| 5,309,007 | 5/1994 | Kelner et al. | 257/286 |
| 5,349,209 | 9/1994 | Moyer et al. | 257/80 |
| 5,355,093 | 10/1994 | Treado et al. | 330/45 |
| 5,355,380 | 10/1994 | Lin et al. | 372/5 |
| 5,414,272 | 5/1995 | Watanabe et al. | 257/10 |
| 5,420,443 | 5/1995 | Dreifus et al. | 257/77 |

OTHER PUBLICATIONS

Geis et al., Diamond Cold Cathodes, *Applications of Diamond Films and Related Materials*, Elsevier Science Publishers, B.V., (1991) pp. 309–310.

Zimmerman et al., A Fabrication Method for the Integration of Vacuum Microelectronic Devices, *IEEE Trans. on Electron Devices*, vol. 38, No. 10 (1991). pp. 2294–2303.

(List continued on next page.)

*Primary Examiner*—Benny T. Lee
*Assistant Examiner*—Justin P. Bettendorf
*Attorney, Agent, or Firm*—Bell, Seltzer, Park & Gibson

[57] ABSTRACT

An electron beam device includes a diamond layer positioned downstream from and in the path of an electron beam. This diamond layer has a conductance that is responsive to the electron beam. Two electrical contacts on the diamond layer provide connections to a power source and a load. When the electron beam is on, the diamond layer becomes conductive allowing electrical power to flow from the power source through the diamond layer to the load. Accordingly, the electron beam device can act as a switch, or the electron beam can be modulated to provide an amplifier. The diamond layer is capable of high temperature operation, resists crystal damage, resists corrosion, and provides a high breakdown voltage. At least one of the electrical contacts on the diamond layer preferably comprises a degeneratively doped diamond surface portion. The degeneratively doped diamond surface portion is relatively transparent to the electron beam, has a coefficient of thermal expansion that is matched with the diamond layer, and resists damage caused by the electron beam.

54 Claims, 7 Drawing Sheets

OTHER PUBLICATIONS

Hofer et al., High Average Power Switching in Diamond, *Lawrence Livermore National Laboratory*, 1992 Twentieth International Power Modulator Symposium (1992).

Lin et al., "Electron Beam Activated Diamond Switch Experiments", SPIE, vol. 1873, pp. 97–109, 1993.

ITT, *Reference Data for Radio Engineers,* Electron Tubes, chapter 17 (1975).

Schoenbach et al., Electron–Beam Activated Zinc Selenide and Diamond Switches, *SPIE* 1632 pp. 203–216 (1992).

Joshi et al., Studies of High Field Conduction in Diamond for Electron Beam Controlled Switching, *J. Appl. Phys.* 72 (10) (1992), pp. 4781–4787.

Scarpetti et al., High Power, Electron–Beam Induced Switching in Diamond, *Lawrence Livermore National Laboratory*, Conference Proceedings of the 9th IEEE Pulsed Power Conference (1993).

Moazed et al., A Thermally Activated Solid State Reaction Process for Fabricating Ohmic Contacts to Semiconducting Diamond, *J. Appl. Phys.* 68 (5) (1990) p. 2246.

Parikh et al., Single–Crystal Diamond Plate Liftoff Achieved by Ion Implantation and Subsequent Annealing, *Appl. Phys. Lett.* 61 (26): (1992) pp. 3124–3126.

Marchywka et al., Low Energy Ion Implantation and Electrochemical Separation of Diamond Films, *Appl. Phys. Lett.* 63 (25): (1993) pp. 3521–3523.

Venkatesan et al., Ohmic Contacts on Diamond by B Ion Implantation and Ti–Au Metallization, *IEEE Elec. Device Letts.* 13 (2): (1992) p. 126.

DIAMOND TARGET ELECTRON BEAM DEVICE

FIELD OF THE INVENTION

This invention relates to semiconductor devices, and more particularly to semiconductor electron beam devices.

BACKGROUND OF THE INVENTION

A semiconductor electron beam device operates on the principle that a semiconducting material will normally have a low electrical conductivity impeding the flow of an electrical signal therethrough. Electrical carriers, however, can be generated in the semiconducting material in response to electron bombardment. This generation of electrical carriers, such as electron-hole pairs, increases the conductivity of the semiconducting material allowing the passage of an electrical signal therethrough.

For example, U.S. Pat. No. 4,993,033 to Lin entitled "High Power Fast Switch," discloses a switch for generating pulses of current to a load from a high voltage power source. A laser beam illuminates a cathode which stimulates the emission of pulses of electrons which illuminate a diamond target. These pulses of electrons cause the diamond target to become conductive thereby permitting electric current to pass from a voltage source through the target to a load.

U.S. Pat. No. 5,355,093 to Treado et al. entitled "Compact Microwave And Millimeter Wave Amplifier" discloses an electronic device for amplifying microwave or millimeter wave signals. In this device, the diamond target is mounted within an output circuit containing a resonant cavity and a quarter-wave choke section. A gated field emission array produces a density modulated beam of electrons which illuminates a thin diamond target in a diamond switch connecting a load to a high voltage source. Each electron in each pulse creates a large number of electron-hole pairs in the diamond target, and each surge of current produces an electromagnetic pulse at the load.

U.S. Pat. No. 5,355,380 to Lin et al. entitled "Compact Millimeter Wave Source" discloses a device wherein pulses of electrons illuminate a diamond switch. The diamond switch connects a high voltage source to a load, and electron pulses are provided by a klystron or a traveling wave tube.

The reference by Hofer et al. entitled "High Average Power Switching In Diamond," 20th International Power Modulator Symposium, 1992, discloses the use of a diamond as a high power solid state switch. This switch uses a low current electron beam to control the diamond switch. The high band-gap of diamond results in a high breakdown field or holding voltage, and the high thermal conductivity of diamond mitigates thermal runaway problems. This reference also discloses that electron beams with the required peak power can be generated with diamond surface emitters.

Notwithstanding the above mentioned references, there continues to exist a need in the art for improved semiconductor electron beam devices. This need is particularly critical in high temperature applications. This need is even more critical in applications requiring high frequency operation and fast turn-off times.

SUMMARY OF THE INVENTION

It is therefore an object of the present invention to provide an improved semiconductor electron beam device.

It is another object of the present invention to provide an improved diamond electron beam device capable of high temperature operation.

It is still another object of the present invention to provide a diamond electron beam device having improved sensitivity to the electron beam.

These and other objects are provided according to the present invention by an electron beam device including an electron beam generating source for generating an electron beam, and a diamond layer having a degeneratively doped surface portion on a first face of the diamond layer. The diamond layer is positioned so that the electron beam irradiates the first face, and has a conductance that is responsive to the electron beam. The diamond layer may be an intrinsic diamond layer so that carriers are generated in the layer when irradiated. Alternately, the diamond layer may be lightly doped so as to provide a more uniform conductance through the layer and also provide more stable operation over temperature changes. In still another alternative, the diamond layer may be doped with substantially equal concentrations of n-type and p-type dopants providing an increased number of electron-hole pairs generated in response to the electron beam. This doping may also promote recombination of the electron-hole pairs enabling the production of faster devices.

The degeneratively doped surface portion has a high dopant concentration of either n-type or p-type conductivity, and the dopant concentration preferably exceeds $10^{19}$ atoms per cm$^3$. The diamond layer is preferably oriented so that the electron beam irradiates (or impinges on) at least a portion of the degeneratively doped surface portion. In addition, the electron beam generating means preferably comprises a field emitter, and most preferably, this field emitter has a diamond surface portion. The field emitter may also have a raised emitter tip with an angled surface portion.

The electron beam device may also include a conductive contact layer on a second face of the diamond layer opposite the degeneratively doped surface portion thereby defining a vertical electron beam device. Accordingly, the electron beam irradiates the diamond layer generating electrical carriers in the diamond layer allowing electrical signals to pass from the degeneratively doped surface portion to the electrically conductive contact layer. If the electrically conductive contact layer is also provided by a second degeneratively doped portion of the diamond layer, the diamond layer may comprise a p-i-p, p-i-n, or n-i-n structure. In other words, the degeneratively doped surface portions may have the same predetermined conductivity type or first and second conductivity types. The diamond layer may also comprise a plurality of side-by-side columnar diamond grains. Accordingly, the number of grain boundaries crossed in the vertical path through the diamond layer can be reduced without requiring the use of a single crystal diamond film. In addition, the thickness of the diamond layer may be equal to a penetration depth of the electron beam so that the efficiency of generation of carriers with respect to electron beam current is increased.

The degeneratively doped surface portion may provide a thin conductive layer over the face of the diamond layer which is relatively transparent to the electron beam. Because of its relatively low atomic number, diamond is theorized to be more transparent to the electron beam than a metal contact. Furthermore, any portion of the electron beam that is absorbed by the degeneratively doped diamond will generate carriers which contribute to conduction through the diamond layer. Accordingly, the degeneratively doped surface portion of the diamond layer can extend into the path of the electron beam providing a direct electrical carrier flow path between the degeneratively doped surface portion and the electrically conductive contact layer through the irradiated diamond layer without reducing the efficiency of carrier generation.

Alternately, the electron beam device may include a diamond layer comprising first and second spaced apart degeneratively doped surface portions on the first face. Accordingly, the first and second degeneratively doped surface portions define a carrier flow path through the diamond layer. These degeneratively doped surface portions may comprise the same predetermined conductivity type or first and second conductivity types. The diamond layer may comprise a plurality of side-by-side columnar diamond grains oriented relative to one another and with a tilt and azimuthal mis-orientation of less than about 8° such that the first face of the diamond layer approaches a single crystal morphology. Accordingly, the horizontal carrier flow path through the surface of the diamond layer at the first face will encounter a reduced number of crystalline grain boundaries as compared to a conventional polycrystalline layer.

The electron beam device may be configured to act as a switch. In this configuration, the diamond layer is placed in series with an electrical power supply and an electrical load. When illuminated by the electron beam as discussed above, the diamond layer becomes conductive allowing electrical power to flow through the series path including the electrical power supply, the electrical load, and the diamond layer.

In the alternative, the electron beam device may be configured as an amplifier. In this configuration, the device includes means for modulating the electron beam in response to an electrical signal to be amplified. Accordingly, the electron beam current varies with the input signal. Because the number of carriers present in the diamond layer is directly proportional to the current of the electron beam, the conductivity of the diamond layer varies in response to the input signal. Accordingly, electrical power flowing through the diamond layer is directly proportional to the input signal. The modulating means of this configuration may comprise a resonant cavity or a radio frequency coil.

In another embodiment, the electron beam device includes electron beam generating means for generating an electron beam, and a diamond layer positioned downstream from the electron beam. The diamond layer is oriented so that the electron beam irradiates a first face thereof and has a conductance that is responsive to the electron beam. A semiconducting layer comprising a degeneratively doped semiconducting material is located on the first face of the diamond layer, and an electrically conductive layer on a portion of the semiconducting layer defines an electrical contact therewith. Accordingly, electrical carriers are generated in the diamond layer when irradiated. In addition, carriers are generated when the degeneratively doped semiconducting material of the semiconducting layer is irradiated.

The degeneratively doped semiconducting material may comprise degeneratively doped diamond. Alternatively, the degeneratively doped semiconducting material may comprise one of cubic-BN, SiC, BN, AlN, GaN, InN, a carbon nitride, and a semiconducting polymer. The degeneratively doped semiconducting material may also comprise a type-III nitride alloy including one or more of B, Al, Ga, and In. In addition, the electron beam device may include a second electrically conductive layer on a second face of the diamond layer opposite the first face defining a carrier flow path between the semiconducting layer and the second electrically conductive layer through the diamond layer. Alternatively, the device may include a second semiconducting layer comprising a degeneratively doped semiconducting material on the first face of the diamond layer spaced apart from the first semiconducting layer.

In still another embodiment of the present invention, a method for making a diamond electron beam device includes the steps of providing a diamond layer having a conductance responsive to an electron beam irradiating the diamond layer and forming a sacrificial layer over a portion of the diamond layer. A field emitter is formed on the sacrificial layer opposite the diamond layer. An insulating diamond layer is formed over the field emitter and sacrificial layer, and the insulating diamond layer extends over the sacrificial layer to the diamond layer. The sacrificial diamond layer is selectively removed.

In addition, this method may include the step of forming a degeneratively doped surface portion on the face of the diamond layer. This method may also include the step of providing a conductive layer on the diamond layer opposite the sacrificial layer.

In yet another embodiment of the present invention, a method for making a diamond electron beam device includes the step of ion implanting a surface of a first diamond layer to produce crystal damage below the surface of the first diamond layer. A second diamond layer is formed on the surface of the first diamond layer, and a surface of the second diamond layer opposite the first diamond layer is doped. The second diamond layer is removed from the first diamond layer, and the second diamond layer is assembled with an electron beam source so as to define a diamond electron beam device.

DETAILED DESCRIPTION OF A PREFERRED EMBODIMENT

Figure 1:
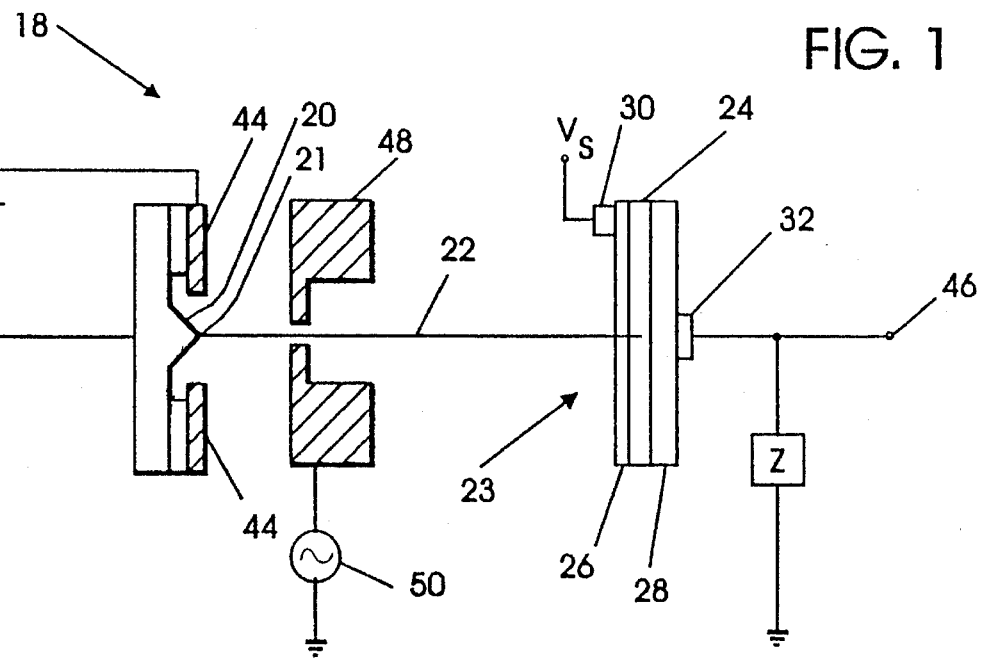
FIG. 1 is a cross-sectional view of an electron beam device having a diamond layer and a vertical carrier flow path through the diamond layer according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those having skill in the art. In the drawings, the thickness of the layers and regions are exaggerated for clarity. Like numbers refer to like elements throughout.

In one embodiment, the vertical electron beam device 18 of the present invention includes electron beam generating means such as a field emitter 20 for generating an electron beam 22, and an electron beam target 23 including a diamond layer 24 for receiving the electron beam, as shown in FIG. 1. The diamond layer 24 has an electrical conductance which is responsive to the electron beam. Accordingly, diamond layer 24 has a low conductance when the electron beam is off, but the conductance increases as the electron beam current increases. A first electrically conductive layer 26 on a first face of the diamond layer 24 is electrically connected to electrical power source $V_s$, and a second electrically conductive layer 28 on the opposite face of the diamond layer is electrically connected to load impedance Z. As will be understood by one having skill in the art, the connection of the power source $V_s$ and load impedance Z can be reversed with the power source connected to the second electrically conductive layer, and the load impedance electrically connected to the first electrically conductive layer.

The conductivity of diamond layer 24 is directly proportional to the current of the electron beam 26 irradiating the diamond layer 24. When there is no electron beam, the diamond layer 24 provides a highly resistive path between the first and second electrically conductive layers 26 and 28. Accordingly, very little electrical power is transferred from the source $V_s$ to the load Z. When the electron beam 22 penetrates the first electrically conductive layer 26 and irradiates the diamond layer 24, electron-hole pairs are generated in the diamond layer. These electron-hole pairs provide electrical charge carriers thereby reducing the resistance between first and second electrically conductive layers 26 and 28. Accordingly, a vertical carrier flow path can be between first and second electrically conductive layers 26 and 28. Accordingly, a vertical carrier flow path can be provided through the diamond layer 24 in the region where the electron beam irradiates the diamond layer. Higher electron beam currents generate more electron-hole pairs thereby producing a greater reduction in the resistance of the diamond layer 24.

The use of a diamond layer 24 having a conductance responsive to the electron beam in the electron beam target provides significant advantages when compared to the use of other semiconducting materials. Because diamond has a high band-gap of 5.5 eV, there are very few thermally generated carriers. Accordingly, the diamond layer 24 allows the electron beam device to operate at high temperatures. Diamond also provides a relatively high breakdown voltage at approximately 10 MV/cm allowing for high voltage operation. Because of diamond's high thermal conductivity, heat can be readily dissipated thereby facilitating high power operation. In addition, a relatively high crystal damage threshold of 180 keV allows the diamond layer to withstand irradiation by high energy electron beams. Furthermore, because of its high band-gap as compared to other semiconductor materials, diamond is relatively insensitive to visible light. Accordingly, the diamond layer does not require a dark environment because visible light will generate only a limited number of carriers.

Further advantages are realized by using a layer of a highly or degeneratively doped semiconducting material to implement the first electrically conductive layer 26 on the diamond layer 24. Because the electrically conductive layer 26 extends over the portion of the diamond layer 24 that is irradiated by the electron beam, the carrier flow path from conductive layer 26 to conductive layer 28 is reduced. In this arrangement, the electron beam must penetrate the conductive layer 26. By using a layer of a doped semiconducting material, any energy absorbed by the doped semiconducting material of layer 26 produces electron-hole pairs that contribute to the carriers available for the carrier flow path in the diamond layer 24 improving the electron-hole efficiency. This doped semiconducting layer can be provided by conventional CVD techniques and doped in situ or doped by ion implantation.

Preferably, a degeneratively doped diamond layer is used to implement the first electrically conductive layer 26 on the diamond layer 24. A degeneratively doped diamond layer is relatively transparent to the electron beam because of its relatively low atomic number. Accordingly, only a small amount of energy from the electron beam is absorbed by the layer. Any energy absorbed in the layer is converted to electron-hole pairs. Because of diamond's high crystal damage threshold of 180 keV, a degeneratively doped diamond layer that is used to implement layer 26 can withstand irradiation by the electron beam. In addition, the use of a degeneratively doped diamond layer on the diamond layer 24 means that the two layers have matched coefficients of thermal expansion thereby reducing stress in the device when heat is generated in high power applications.

The doped diamond layer also provides a good electrical contact to the diamond layer 24. An electrically conductive contact layer such as metal contact 30 can be used to connect the degeneratively doped diamond layer to the power source $V_s$. The metal contact may comprise a metal carbide former such as W, Mo, Ti, Ta, etc. This diamond layer can be provided by implanting a surface portion of diamond layer 24, or by using chemical vapor deposition techniques to grow a diamond layer and providing in situ doping. The dopant concentration of this degeneratively doped diamond layer is preferably greater than $10^{19}$ atoms per $cm^3$.

Alternately, the electrically conductive layer 26 can be implemented by a degeneratively doped semiconductor material providing a heterojunction structure. The layer 26 can comprise cubic-BN, SiC, BN, AlN, GaN, InN, or a carbon-nitride, for example. In addition, the layer 26 can comprise a type-III nitride alloy including one or more of B, Al, Ga, and In. Furthermore, the layer 26 can comprise a semiconducting polymer as discussed, for example, in U.S. Pat. No. 5,349,209 to Moyer et al., the disclosure of which is hereby incorporated in its entirety herein by reference. These materials may provide a layer which can be implanted with an n-type dopant. These materials may also be doped by in situ and diffusion methods as well as by forced diffusion doping where diffusion occurs under an applied bias potential. The lower band-gap of these materials when compared to the diamond layer 24 may also improve the operation of the electron beam device by providing a barrier to minority carriers.

The diamond layer 24 has a conductance responsive to the electron beam. In order to achieve this characteristic, the diamond layer 24 can be an intrinsic semiconducting diamond layer. Alternately, the diamond layer 24 can be lightly doped with either an n-type or p-type dopant providing a dopant concentration of less than about $10^{16}$ atoms per $cm^3$. A lightly doped diamond layer can be used to achieve a more stable carrier concentration and conductivity as well as a more stable off resistance. Lightly doped diamond films can provide an electric breakdown field that is greater than 5 MV/cm, a carrier lifetime of less than 0.1 ps, a carrier mobility that is greater than 50 $cm^2$/Vs, and a resistivity that is less than 50 ohm-cm in the irradiated state.

In another alternative, the diamond layer 24 can be doped with substantially equal concentrations of both n-type and p-type dopants. Few carriers will be active when the electron beam is off because the n-type and p-type dopants in effect counteract each other. Less energy, however, is required to generate carriers in this diamond layer than in an intrinsic diamond layer. Accordingly, when the electron beam irradiates this diamond layer having n-type and p-type dopants, more carriers are generated per electron increasing the induced conductivity of the diamond layer 24. The presence of these dopants also provides carrier traps which reduce the carrier lifetime thereby providing a faster turn-off of the electron beam device. Counteracting n-type and p-type dopants can be used to tailor the characteristics of pulse shapes generated by the electron beam device.

In the vertical electron beam device 18 illustrated in FIG. 1, the second electrically conductive layer 28 may comprise a degeneratively doped portion of the diamond layer 24, and a metal contact 32 may provide a low resistance connection to the electrical load Z. The electrically conductive layer 28 may also include a supporting substrate. Accordingly, the electron beam target 23 may comprise a diamond layer with degeneratively doped layers providing electrically conductive layers 26 and 28 on both faces. This structure will minimize internal stresses because all three layers have the same coefficient of thermal expansion. This structure will also provide low resistance contacts between each layer.

Each of these degeneratively doped layers are preferably doped with either a p-type or an n-type dopant with a dopant concentration of greater than $10^9$ atoms per $cm^2$. Accordingly, the diamond layer may have one of a p-i-n, p-i-p, or n-i-n structure. In other words, the degeneratively doped diamond layers may have either the same or opposite conductivity types. These layers may be formed by either ion implantation or in situ doping.

Alternately, the second electrically conductive layer 28 may comprise a metal layer. Metal layers could also be used to implement the first electrically conductive layer 26. Carbide forming metals such as W, Mo, Ti, Ta, etc. are preferred as these metals form a low resistance contact with diamond. The second electrically conductive layer 28 may alternately comprise cubic-BN, SiC, BN, AlN, GaN, InN, a carbon nitride, a type-III nitride alloy, or a semiconducting polymer.

For the vertical electron beam device 18, the thickness of the diamond layer 24 is preferably equal to the penetration depth of the electron beam into the diamond. At this thickness, all of the electrons are absorbed by the diamond layer providing a high electron-hole conversion efficiency. In addition, no space charge limited conduction is required to transport carriers across an excess thickness. If the first electrically conductive layer 26 is a degeneratively doped diamond layer, then the desired range of thickness t for the combination of the diamond layer 24 and the first electrically conductive layer 26 can be expressed as:

$$0.4 \times 0.018 E^{1.825} < t < 0.8 \times 0.018 E^{1.825};$$

where t is the diamond thickness in μm, and E is the electron beam energy in keV.

Figure 2:
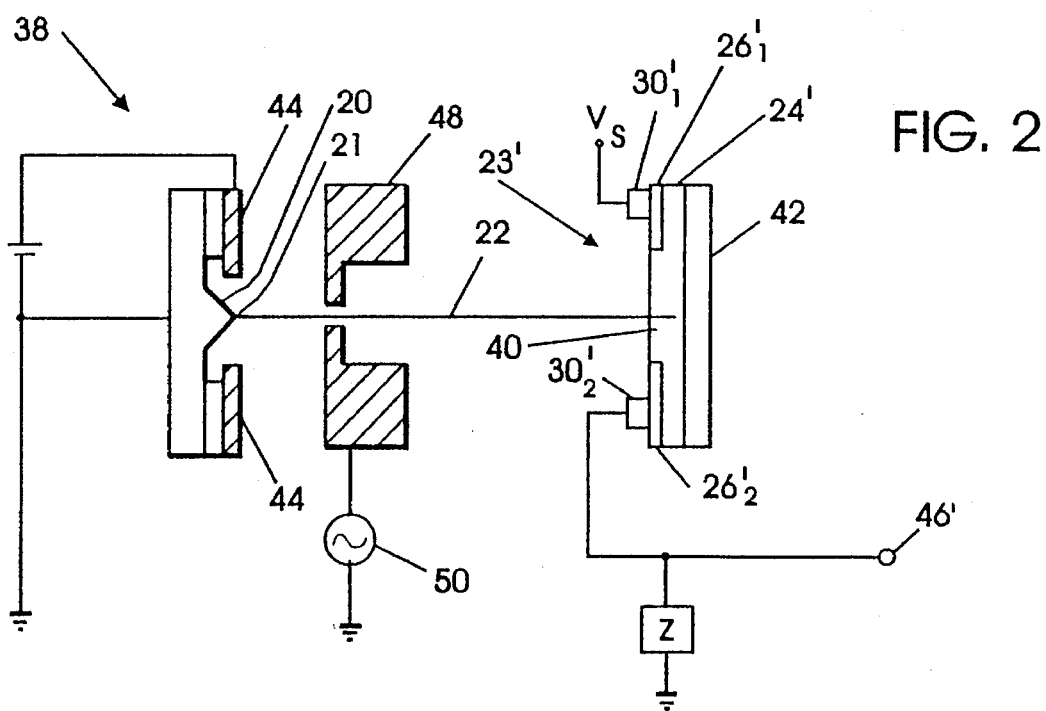
FIG. 2 is a cross-sectional view of an electron beam device having a diamond layer and a horizontal carrier flow path through the diamond layer according to the present invention.

In FIG. 2, there is illustrated a horizontal electron beam device 38 including electron beam generating means such as a field emitter 20 for generating an electron beam 22, and an electron beam target 23' including diamond layer 24' for receiving an electron beam. As discussed with regard to the vertical electron beam device, the diamond layer 24' has an electrical conductance which is responsive to the electron beam. The horizontal device, however, includes first and second spaced-apart electrically conductive layers $26_1'$ and $26_2'$ on the face of diamond layer 24' adjacent the field emitter 20. These spaced-apart layers define an exposed portion 40 of the diamond layer 24' where the electron beam irradiates the diamond layer 24'. In addition, a thin passivation layer may be provided on the surface of the diamond layer 24' adjacent the field emitter 20 to prevent surface flashover and degradation of the surface over time. The passivation layer may comprise a thin layer of silicon dioxide, silicon nitride, or other passivation material.

The exposed portion 40 defines a carrier flow path between the two spaced-apart electrically conductive layers. Accordingly, the first electrically conductive layer $26_1'$ is electrically connected to the electrical power source $V_s$, and the second electrically conductive layer $26_2'$ is electrically connected to the electrical load Z. When the electron beam 22 irradiates the diamond layer 24', carriers are generated in the diamond layer, and electrical power is transferred from the electrical power source $V_s$ through the diamond layer 24' to the electrical load Z. Because the number of carriers generated in the diamond layer 24' is directly proportional to the electron beam current, the conductivity of the carrier flow path between the two electrically conductive layers is also directly related to the electron beam current.

As discussed with regard to the vertical electron beam device, diamond is the preferred material for the electron beam target because of its high band-gap, high breakdown voltage, high thermal conductivity, and high crystal damage threshold. The diamond layer 24' can be implemented with intrinsic diamond, lightly doped diamond having either n-type or p-type conductivity, or diamond doped with substantially equal concentrations of n-type and p-type dopants, as is also discussed above with regard to the vertical device.

In the horizontal device of FIG. 2 the distance between the electrically conductive layers $26_1'$ and $26_2'$ defines the length of the horizontal carrier flow path through the diamond layer 24'. The location of these electrically conductive layers is determined by the photolithographic process used to form them. Accordingly, the length of the carrier flow path is determined by photolithographic processing and not by the thickness of the layers. For example, if an implant is used to form the electrically conductive layers in the diamond layer 24', the mask used during the implant process defines the length of the carrier flow path. Accordingly, the gain of a horizontal electron beam amplifier, which is dependent on the spacing of the electrically conductive layer $26_1'$ and $26_2'$, can be easily controlled by the photolithographic processing.

The electrically conductive layers $26_1'$ and $26_2'$ may comprise a metal which forms a low resistance contact with diamond. Metals which form carbides such as W, Mo, Ti, and Ta are preferred. Preferably, however, the electrically conductive layers comprise a degeneratively doped semiconducting material. These layers can be formed by selective deposition of the semiconductor material as will be understood by one having skill in the art. The degenerative doping can be achieved by either ion implantation or in situ doping.

By using spaced-apart layers of degeneratively doped semiconducting material, the conductive layers $26_1'$ and $26_2'$ can each be located so that a portion of the electron beam 22 irradiates an edge of each layer adjacent the exposed portion 40 of the diamond layer. As discussed above, the doped semiconducting material will generate carriers in response to electron beam irradiation contributing to the conductance of the carrier flow path. Accordingly, the conductive layers can be placed close together thereby avoiding a gap between the irradiated diamond and either conductive layer without reducing the generation of carriers.

Most preferably, degeneratively doped diamond layers are used to implement the conductive layers $26_1'$ and $26_2'$. The degeneratively doped diamond layers $26_1'$ and $26_2'$ in combination with the diamond layer 24' may comprise a p-i-p, n-i-p, or n-i-n structure. In other words, the degeneratively doped diamond layers may have either the same or opposite conductivity types.

As discussed above, diamond is relatively transparent to the electron beam, diamond generates carriers in response to irradiation by the electron beam, diamond has a high crystal damage threshold, and diamond reduces thermal stresses. These diamond layers are also easily fabricated by implanting the existing diamond layer 24'. Selective diamond deposition and in situ doping may also be used. Metal contacts $30_1'$ and $30_2'$ may be used to connect conductive diamond layers $26_1'$ and $26_2'$ respectively to electrical power source $V_s$ and electrical load Z. These metal contacts preferably comprise a carbide forming metal such as W, Mo, Ti, Ta, etc.

Alternately, doped semiconducting materials providing a heterojunction may be used to form the conductive layers $26_1'$ and $26_2'$. Preferred materials include cubic-BN, SiC, BN, AlN, GaN, InN, and carbon-nitrides. In addition, type-III nitride alloys including one or more of B, Al, Ga, and In may be used. In addition, semiconducting polymers as discussed in U.S. Pat. No. 5,349,209, for example, may be used. The use of one or more of these materials may allow the conductive layer to be doped with an n-type dopant. Conductive layers with one or more of these materials can also provide a barrier to minority carriers.

The electron beam generating means of either the vertical electron beam device of FIG. 1 or the horizontal electron beam device of FIG. 2 may comprise a thermonic emission source, a secondary emission source, a photo emission source, or a field emission source. Preferably, a field emission source such as field emitter 20 is used, and the field emitter most preferably comprises a diamond field emission tip or a diamond coated tip as shown in U.S. Pat. No. 5,290,610 and No. 5,129,850 both to Kane et al., the disclosures of which are both incorporated in their entirety herein by reference. Because diamond has a negative electron affinity, electron emission can be initiated with a reduced electric field thereby providing an efficient electron beam source. The use of a field emitter also obviates the need for the heating element required by a thermonic source and the laser required for a photo emission source. Further advantages can be realized by providing a field emitter having a raised emitter tip 21 with an angled surface, such as a pyramid or cone shaped emitter tip. The angled surface further reduces the electric field required to generate the electron beam.

The devices illustrated in FIGS. 1 and 2 may be configured to operate as switches. Both devices use an electron beam 22 to control the conductivity of the diamond layer 24 or 24'. When the electron beam is on, carriers are generated in the diamond layer 24 or 24' allowing electrical power to flow from the electrical power source $V_s$ through the diamond layer 24 or 24' to the load impedance Z. When the electron beam is off, the carriers in the diamond layer recombine shutting off power to the load impedance Z. For switch applications, a pulse forming network or Blumlein circuit may be used to charge up the diamond target 23 or 23' to a high voltage. Because the carrier lifetime in diamond is very short, the switching speed can be on the order of less than 1ns allowing short pulse widths and high repetition rates. The electron beam can be turned on and off by controlling the electric field between the field emitter 20 and the diamond layer 24 or 24'. Alternately, the electron beam can be turned on and off by varying the electric field between the field emitter 20 and the extraction electrodes 44.

An electron beam device can operate as an amplifier by modulating the electron beam 22. Because the conductivity of the diamond layer 24 is directly proportional to the electron beam current, variations in the electron beam current will result in proportional variations in a signal produced at output 46. Amplification is possible because the electron beam will generate one electron-hole pair for every 16.5 eV of energy that is dissipated. With beam energies just below the diamond crystal damage threshold of 180 keV, a gain of approximately 11,000 carriers per incident electron is possible.

The electron beam can be modulated in different ways as illustrated in FIGS. 1–6. FIGS. 1 and 2 both illustrate an electron beam amplifier wherein a DC bias on the extraction electrodes 44 produces a constant electron beam. The modulator 48, such as an RF coil or Klystron cavity, modulates the electron beam according to an input signal supplied by signal generator 50. The only difference between the two illustrations is that in FIG. 1, the electron beam target 3, including diamond layer 24, has a vertical structure; while in FIG. 2, the electron beam target 23', including the diamond layer 24', has a horizontal structure.

Figure 3:
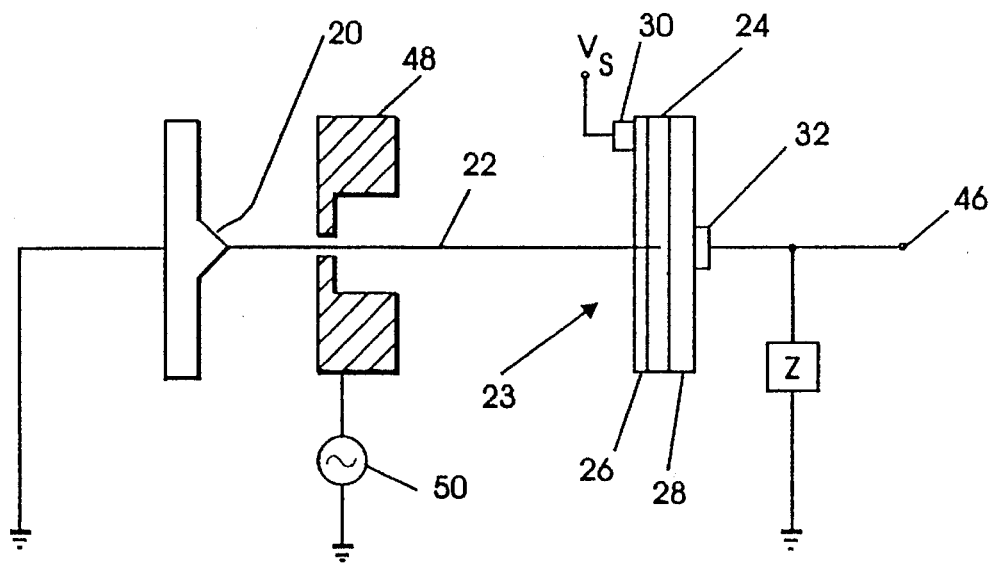
FIG. 3 is a cross-sectional view of an electron beam amplifier with an electron beam modulator and a vertical target structure.

Alternate amplifier structures are illustrated in FIGS. 3–6. While each of these figures illustrates an electron beam target 23, including diamond layer 24 and contact layers, having a vertical structure, it will be understood by one having skill in the art that these amplifier structures can also be implemented with a horizontal diamond layer and contact layer structure. In FIG. 3, a DC bias between the diamond layer 24 and the field emitter 20 is sufficient to produce an electron beam eliminating the need for extraction electrodes. The modulator 48, such as an RF coil or a Klystron cavity, modulates the signal in response to a signal from signal generator 50.

Figure 4:
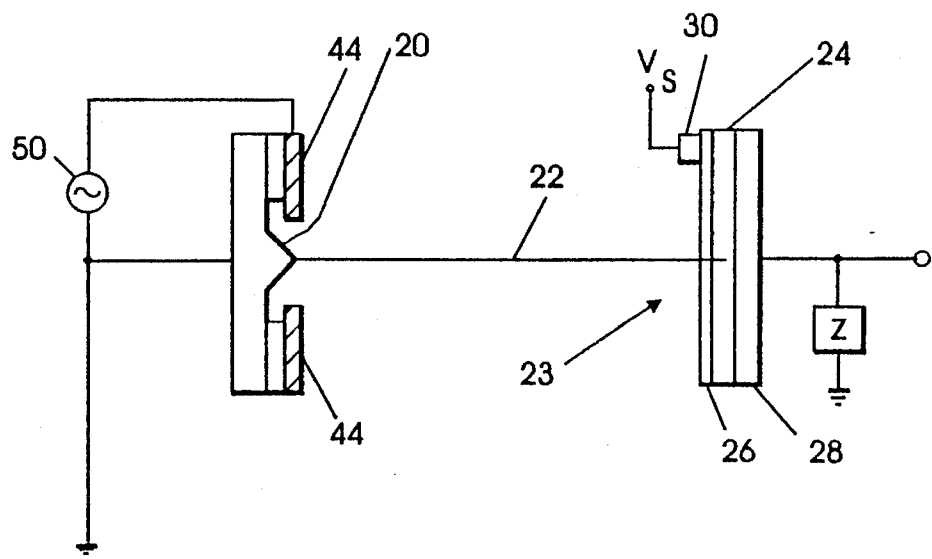
FIG. 4 is a cross-sectional view of an electron beam amplifier with extraction electrodes used to modulate the electron beam.
Figure 5:
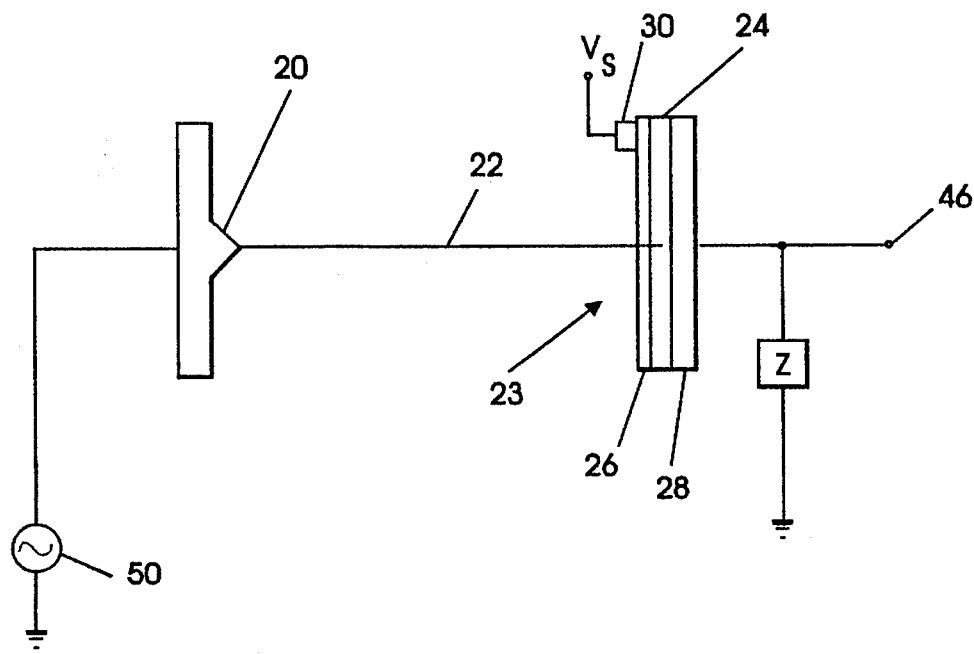
FIG. 5 is a cross-sectional view of an electron beam amplifier with an input signal applied directly to the field emitter.

In FIG. 4, an electric field between the field emitter 20 and the diamond layer 24 is sufficient to induce an electron beam 22. In this illustration, the electron beam is modulated by an electric signal from signal generator 50 which is applied to the extraction electrodes 44. In FIG. 5, the electron beam is both generated and modulated in response to an electric signal supplied by signal generator 50 which is applied directly to the field emitter 20.

Figure 6:
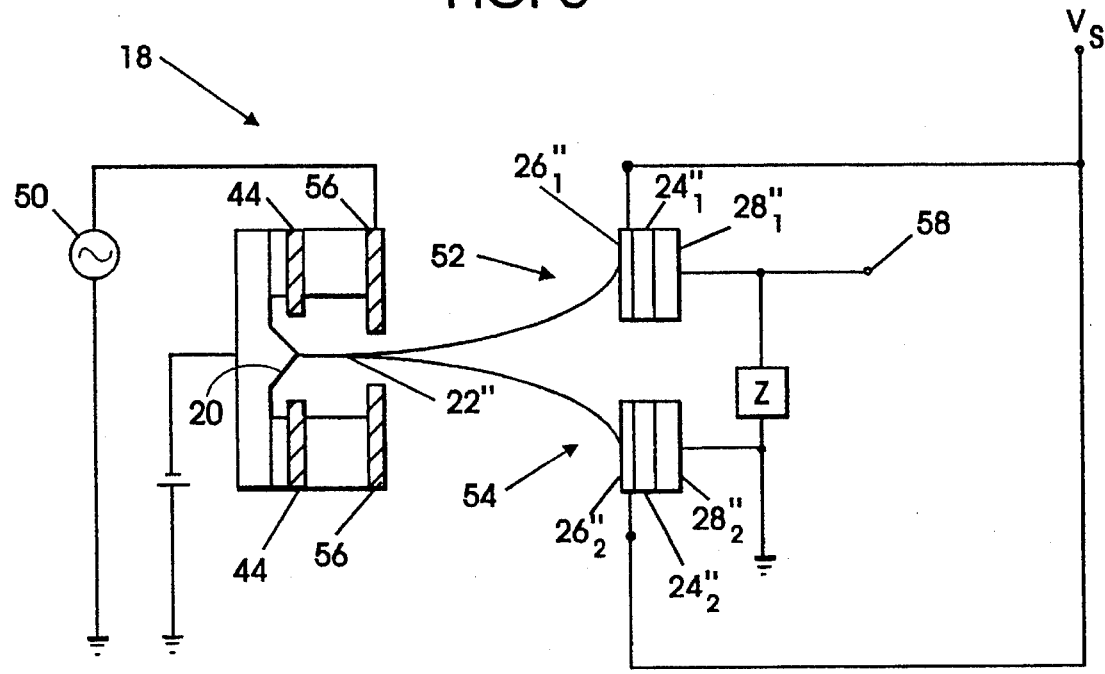
FIG. 6 is a cross-sectional view of an electron beam amplifier with two electron beam targets.

The electron beam amplifier shown in FIG. 6 includes a field emitter 20 for generating the electron beam 22"; a first electron beam target 52 including diamond layer $24_1"$ and electrically conductive layers $26_1"$ and $28_1"$; and a second electron beam target 54 including diamond layer $24_2"$ and electrically conductive layers $26_2"$ and $28_2"$. This device also includes extraction electrodes 44 and deflection electrodes 56. A DC electrical bias applied to the extraction electrodes produces a constant electron beam 22", while an electrical signal generated by signal generator 50 and applied to the deflection electrodes 56 redirects the electron beam toward the first and second targets during positive and negative signal cycles respectively. This causes the conductivity of each of the diamond layers $24_1''$ and $24_2''$ to modulate. The signals from each target experience constructive interference via the impedance element Z" to produce an output signal at terminal 58.

Figure 7:
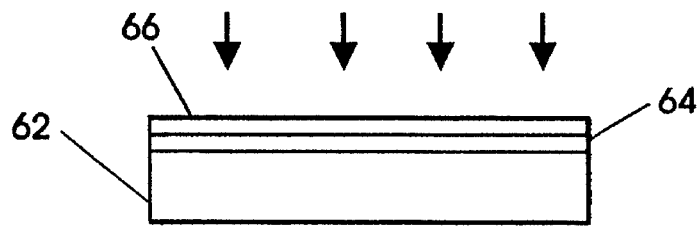
FIGS. 7–11 illustrate the fabrication of an electron beam device using a lift-off technique.
Figure 8:
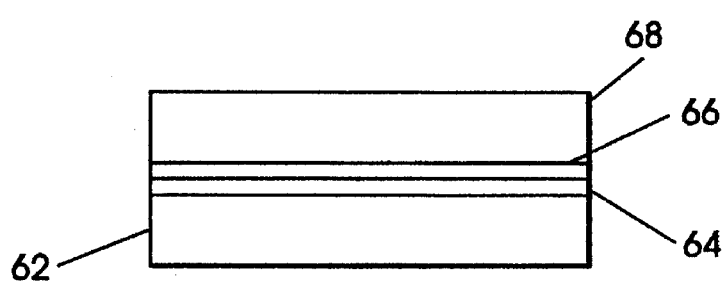
Figure 9:
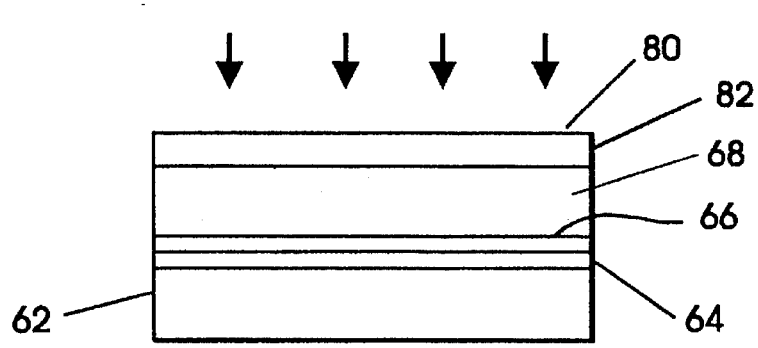
Figure 10:
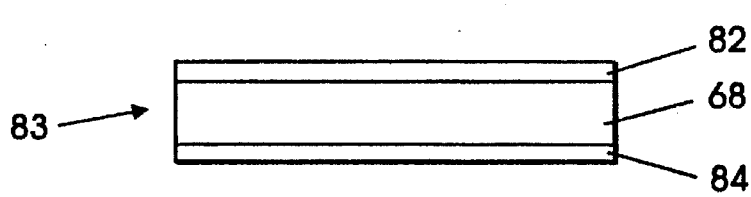

An electron beam device can be fabricated according to the present invention by forming a discrete electron beam target and then mounting the target on a field emission structure as shown in FIGS. 7–11. The electron beam target is fabricated by implanting a first diamond layer 62 to produce an ion implant damage region 64 below the surface 66 of the diamond layer 62, as shown in FIG. 7. A second diamond layer 68 is then formed on the surface 66 of the first diamond layer, as shown in FIG. 8. This layer can be formed by conventional CVD techniques as will be understood by one having skill in the art. The exposed surface 80 of the second diamond layer can optionally be implanted to provide a doped region 82, as shown in FIG. 9. Alternately, a layer of a conductive material can be applied to exposed surface 80.

Figure 11:
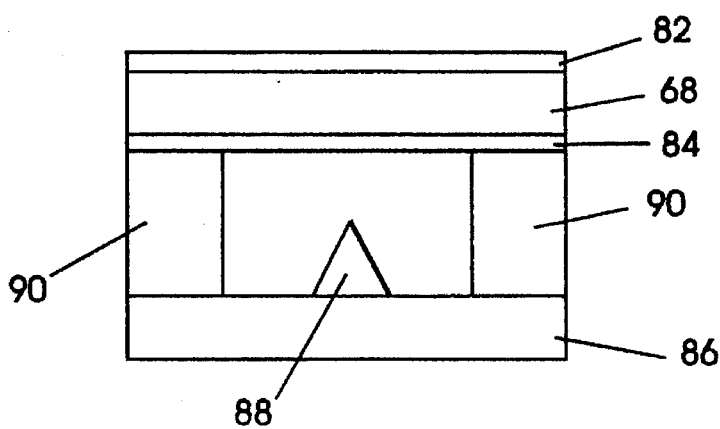

The structure of FIG. 9 can then be annealed and a lift-off technique used to separate the second diamond layer 68 from the first diamond layer 62. The resulting structure defining an electron beam target 83, shown in FIG. 10, has a doped region 84 which diffused from the implant region 64 during the annealing step. This structure may also have an optional doped region 82. As shown in FIG. 11, the electron beam target 83 is mounted on a separate field emitter structure including a substrate 86, a field emitter 88, and insulating supports 90. If necessary, a conductive layer may be provided on the exposed surface of the electron beam target structure.

Figure 12:
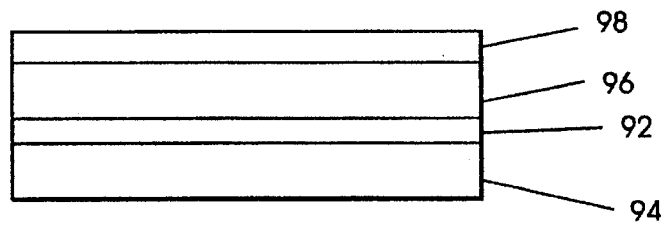
FIGS. 12–16 illustrate the fabrication of an electron beam device on a single substrate.

In an alternative method of fabrication, an electron beam device is fabricated on a single substrate eliminating the need to assemble discrete parts. One embodiment of this fabrication method is illustrated in FIGS. 12–16. A first conductive diamond layer 92 is formed on substrate 94, and a second diamond layer 96 having a low conductivity is formed on the first layer. A third conductive diamond layer 98 is formed on the second layer thereby completing the electron beam target structure. Each of these layers can be formed by conventional CVD techniques, and doping can be provided either by in situ doping or by ion implantation. The resulting structure is illustrated in FIG. 12.

Figure 13:
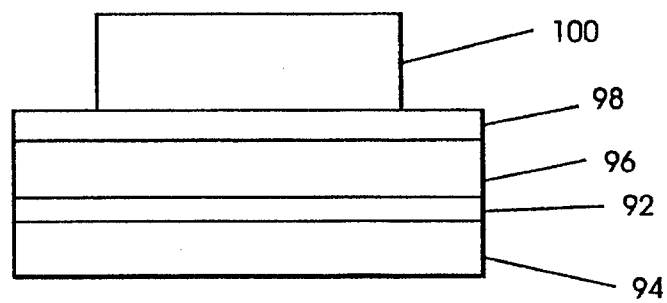
Figure 14:
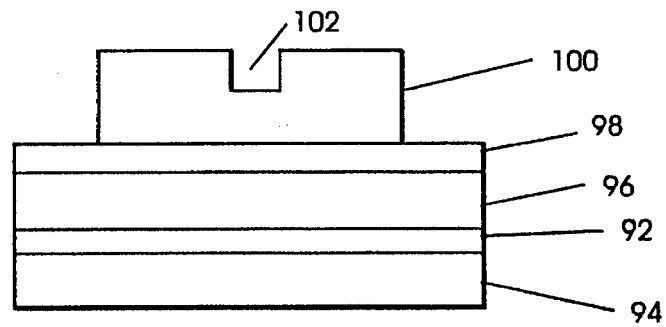
Figure 15:
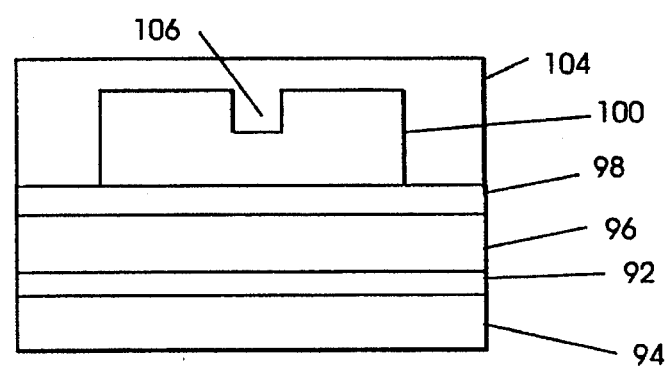

A sacrificial layer 100 is formed over a portion of the third diamond layer 98, as shown in FIG. 13. The sacrificial layer 98 comprises a material which can be selectively removed from the diamond structure by methods such as chemical etching. For example, the sacrificial layer may comprise materials such as silicon dioxide or silicon. A pattern, such as notch 102 may be formed in the sacrificial layer 100 defining a shape of a field emitter tip, as shown in FIG. 14. An insulating diamond layer 104 is then deposited on the sacrificial layer so as to form the emitter tip 106. The insulating diamond layer 104 is deposited so as to cover the sacrificial layer 100 and bond with the diamond layer 98 as shown in FIG. 15. As will be understood by one having skill in the art, the notch 102 may be formed so that the resulting emitter tip 106 is a raised emitter tip with an angled surface portion such as a pyramid or cone as shown in FIG. 1.

Figure 16:
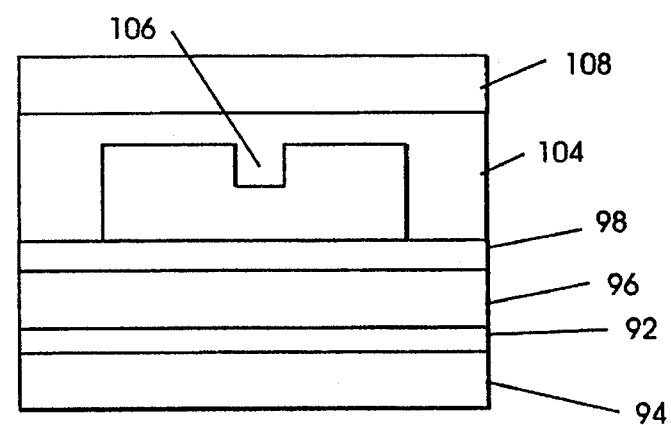

A conducting diamond layer 108 can then be provided on the insulating diamond layer 104, and the sacrificial layer selectively removed as shown in FIG. 16. Accordingly, a vertical electron beam device can be fabricated on a single substrate without assembling discrete components. Alternately, a horizontal structure can be fabricated by selectively doping the diamond layer 98 so as to define two spaced apart conductive regions.

The diamond layers used to form the electron beam target may comprise single crystal diamond or polycrystalline diamond. A single crystal diamond may be either a natural diamond crystal, a hetero-epitaxial diamond crystal, or a homo-epitaxial diamond crystal. A single crystal diamond layer provides a carrier flow path which does not cross crystal grain boundaries, but may be difficult to produce. A polycrystalline diamond layer can be produced more easily than a single crystal layer, but the resulting carrier flow path may cross crystal grain boundaries.

Accordingly, it may be preferred to use oriented diamond layers comprising side-by-side columnar crystal grains which may extend through the thickness of the diamond layer. Accordingly, the number of grain boundaries crossed by a carrier flow path extending vertically through the thickness of the diamond layer may be reduced as compared to a randomly oriented diamond layer without requiring the formation of a single crystal structure. By orienting these columnar crystal grains, the diamond layer can be grown so that the grains grow together producing a substantially single crystal morphology at the surface of the diamond layer. Accordingly, the grain boundaries encountered by a horizontal carrier flow path across the surface of the diamond layer can be reduced.

The diamond layer for each of the electron beam devices may preferably be provided by a highly oriented diamond layer having a plurality of side-by-side columnar diamond grains oriented relative to one another and with a tilt and azimuthal mis-orientation of less than about 8°. Since the surface of this highly oriented diamond layer is smooth, extensive polishing will not be required, and the fabrication process is simplified. In addition, diamond has the advantages of a large thermal conductivity, a high band-gap, a high breakdown voltage, and a high crystal damage threshold. Diamond's high thermal conductivity results in improved thermal management allowing a diamond device to handle more power than a comparable conventional semiconductor device. Furthermore, diamond is inert to most chemicals and chemical reactions making it ideally suited for use in hazardous environments.

Figure 17:
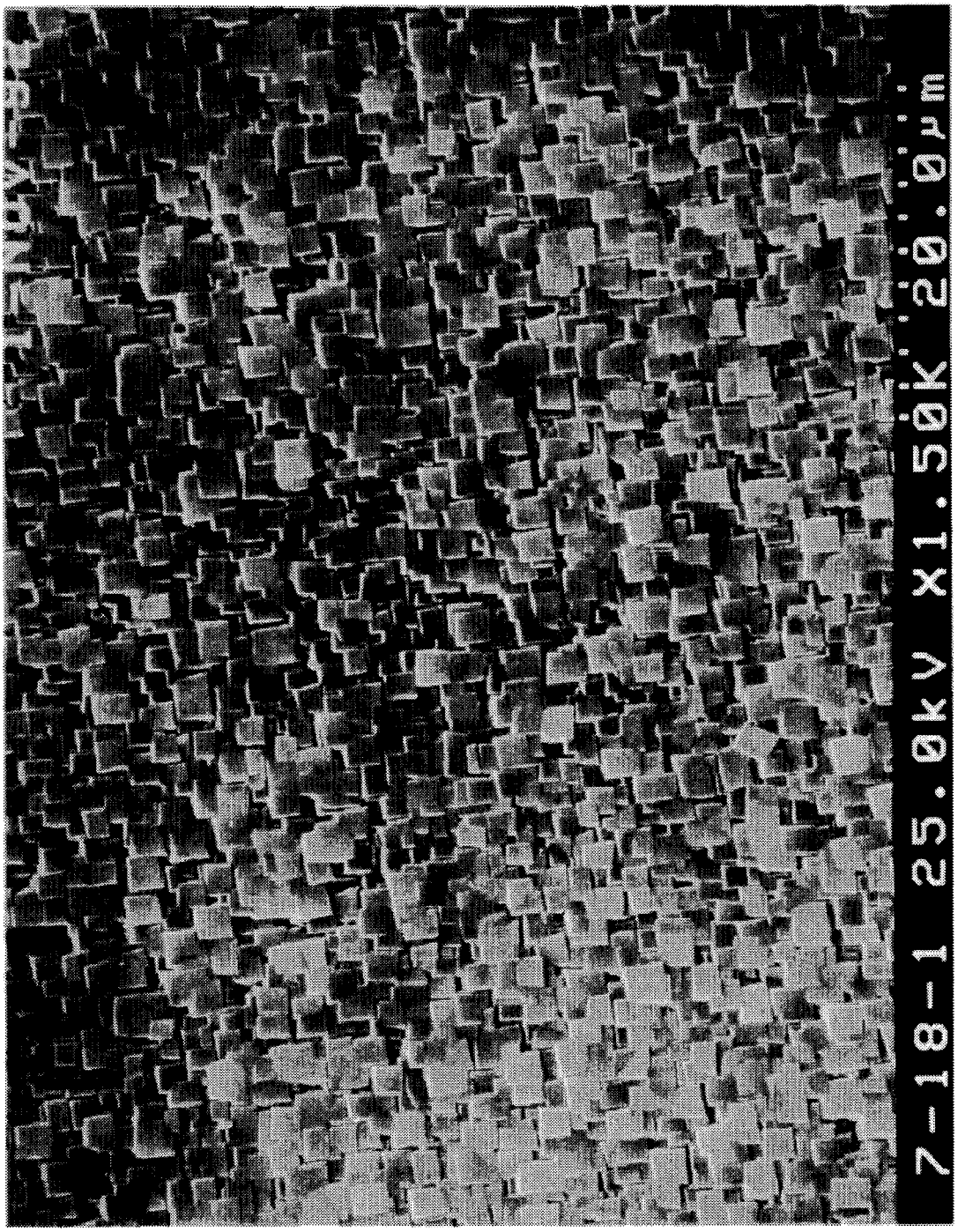
FIG. 17 is a photomicrograph of the surface of a highly oriented diamond layer.
Figure 18:
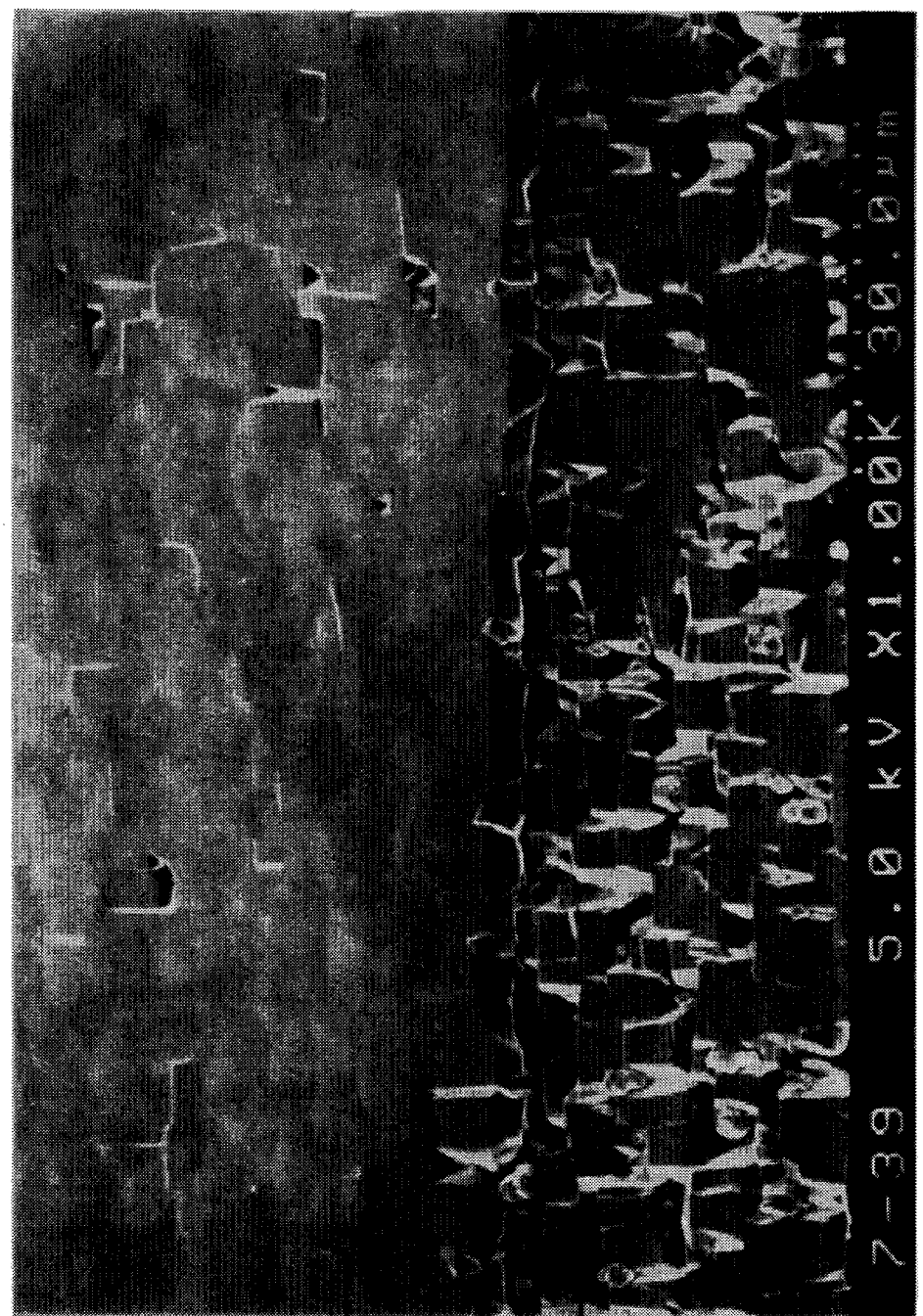
FIG. 18 is a photomicrograph of a highly oriented diamond layer with a surface approaching a single crystal morphology.

FIG. 17 is a photomicrograph illustrating a highly oriented diamond layer 110, wherein not only are the exposed faces parallel, but they are also rotationally aligned thereby permitting grain boundaries to substantially disappear with continued diamond growth as shown in FIG. 18. The highly oriented diamond layer 110 is further described in copending U.S. patent applications Ser. No. 08/035,643, filed on Mar. 23, 1993 entitled *Microelectronic Structures on a Nondiamond Substrate and Associated Fabrication Methods* and Ser. No. 08/166,408, filed on Jan. 13, 1993 entitled *Electrochemical Cell Having Diamond Electrode And Methods For Making Same*, both assigned to the assignee of the present invention, the entire disclosures of which are hereby incorporated herein by reference.

The highly oriented diamond layer 110 includes a plurality of side-by-side columnar single crystal diamond grains extending outwardly from the nondiamond substrate (not shown). Substantially all of the columnar single crystal diamond grains are preferably oriented with a tilt and azimuthal mis-orientation of less than about 8°, and more preferably, less that about 5° relative to the single crystal nondiamond wafer. The diamond nucleation site density, or concentration is also relatively high, that is, greater than about $10^4/cm^2$ and, more preferably, greater than about $10^5/cm^2$. The method for making the highly oriented diamond layer includes carburizing the wafer surface, nucleating the carburized wafer, and growing diamond onto the nucleated wafer to favor growth of the (100)-oriented face. In addition, a carbide interfacial layer is preferably formed between the highly oriented diamond layer 110 and the nondiamond substrate (not shown).

Nucleating the carburized wafer face preferably includes exposing the wafer face to a carbon containing plasma while electrically biasing another diamond layer adjacent the wafer face and which is also exposed to the plasma. The electrical biasing is preferably carried out at a peak absolute value of not less than about 250 volts negative with respect to ground. The electrical bias supplied may be pure DC, pulsed DC, alternating current (AC 50 or 60 Hz), or radio frequency (RF).

Without wishing to be bound thereto, applicants theorize that the adjacent diamond layer contributes to the enhancement of diamond nucleation by either of two mechanisms. First, it is theorized that the diamond is chemically transported from the adjacent diamond film to the wafer. In other words, it is possible that the diamond is being moved from the diamond film adjacent the wafer face via an etching and deposition process. A second theory is that increased gas phase dissociation is caused by electron emission from the diamond film and that a higher concentration of dissociated hydrocarbons are being created by this electron dissociation process.

Exposing both the nondiamond wafer and the adjacent diamond layer to the carbon-containing plasma preferably includes exposing both to the carbon-containing plasma having an atomic percentage of carbon of not more than about 0.3 atomic percent, such as provided by a methane gas plasma mixture having a percentage of methane of not more than about 5 percent by weight. The face of the wafer may also preferably be optically monitored and the electrical biasing discontinued responsive to a change in the substrate indicative of the start of growth of a diamond film on the wafer. For example, laser reflection interferometry or optical pyrometry may be used to monitor the face of the substrate.

Diamond is preferably deposited onto the wafer while controlling processing conditions to favor growth of diamond having a (100)-oriented outer face. Other orientations for the outer face are also possible to achieve and may be desirable in certain applications. For example, (110) and (111) orientations may also be readily obtained by controlling diamond growth conditions to favor these orientations as would be readily understood by those skilled in the art.

The highly oriented diamond layer 110 permits the use of a relatively inexpensive wafer or substrate material, such as silicon, on which a high quality diamond layer may be formed. Diamond may be further deposited onto the highly oriented diamond layer, as would be readily appreciated by those skilled in the art, until a single crystal surface morphology were approached by outer portions of the diamond layer as shown in FIG. 18. In FIG. 18, a highly oriented diamond layer 112 is illustrated in a photomicrograph taken from a prospective view showing both a cross-section 116 and an upper surface 114 of the layer. The surface 114 of this layer approaches a single crystal morphology.

The alignment of the diamond crystals reduces any need to polish the surface of the diamond film. The alignment of the crystals also reduces voids in the diamond layer. Most importantly, the alignment reduces grain boundaries encountered by a carrier flow path in the diamond layer thereby improving the performance of electron beam devices incorporating these diamond layers.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An electron beam device comprising:

electron beam generating means for generating an electron beam;

a diamond layer positioned downstream from the electron beam and oriented so that the electron beam irradiates a first face thereof so that said diamond layer defines an electron beam target, said diamond layer having a conductance responsive to the electron beam, and said diamond layer comprising a first degeneratively doped surface portion on the first face;

an electrically conductive layer on a portion of said first degeneratively doped surface portion of said diamond layer defining a first electrical contact therewith; and a second electrical contact on said diamond layer;

wherein said first degeneratively doped surface portion of said diamond layer is positioned in the path of the electron beam, and said electrically conductive layer defines an exposed portion of said first degeneratively doped surface portion in the path of the electron beam.

2. An electron beam device according to claim 1 wherein said second electrical contact comprises an electrically conductive layer on a second face of said diamond layer opposite the first face, defining a carrier flow path between said first degeneratively doped surface portion and said second electrical contact through said diamond layer.

3. An electron beam device according to claim 2 wherein said diamond layer has a predetermined thickness substantially equal to a penetration depth of the electron beam.

4. An electron beam device according to claim 2 wherein said diamond layer comprises a plurality of side-by-side columnar diamond grains.

5. An electron beam device according to claim 1 wherein said second electrical contact comprises a second degeneratively doped surface portion on the first face of said diamond layer, said second degeneratively doped surface portion being spaced apart from said first degeneratively doped surface portion, said first and second degeneratively doped surface portions defining a carrier flow path through said diamond layer.

6. An electron beam device according to claim 5 wherein said diamond layer comprises a plurality of side-by-side columnar diamond grains oriented relative to one another and with a tilt and azimuthal mis-orientation of less than about 8° such that the first face of said diamond layer approaches a single crystal morphology.

7. An electron beam device according to claim 1 wherein said electron beam generating means comprises a field emitter.

8. An electron beam device according to claim 7 wherein said field emitter comprises a diamond surface portion and a raised emitter tip with an angled surface.

9. An electron beam device according to claim 1 further comprising modulation means adjacent the path of the electron beam for modulating the electron beam so that said electron beam device defines an electron beam amplifier.

10. An electron beam device according to claim 1 wherein said diamond layer comprises a lightly doped diamond layer.

11. An electron beam device according to claim 1 wherein said diamond layer comprises doped diamond having substantially equal concentrations of n-type and p-type dopants.

12. An electron beam device according to claim 1 wherein said degeneratively doped surface portion comprises a diamond surface portion having a dopant concentration of greater than $10^{19}$ atoms per $cm^3$.

13. An electron beam device comprising:

electron beam generating means for generating an electron beam;

a diamond layer positioned downstream from the electron beam and oriented so that the electron beam irradiates a first face thereof so that said diamond layer defines an electron beam target, said diamond layer having a conductance responsive to the electron beam;

a semiconducting layer comprising a degeneratively doped semiconducting material on the first face of said diamond layer; and an electrically conductive layer on a portion of said semiconducting layer defining an electrical contact therewith;

wherein said degeneratively doped semiconducting material comprises one of cubic-BN, SiC, BN, AlN, GaN, InN, a type-III nitride alloy, a carbon-nitride, and a semiconducting polymer.

14. An electron beam device according to claim 13 further comprising a second semiconducting layer comprising a degeneratively doped semiconducting material on the first face of said diamond layer, said second semiconducting layer being spaced apart from said first semiconducting layer, said first and second semiconducting layers defining a carrier flow path through said diamond layer.

15. An electron beam device according to claim 14 wherein said diamond layer comprises a plurality of side-by-side columnar diamond grains oriented with a tilt and azimuthal mis-orientation of less than about 8° such that the first face of said diamond layer approaches a single crystal morphology.

16. An electron beam device according to claim 13 wherein said electron beam generating means comprises a field emitter having a diamond surface portion and a raised emitter tip with an angled surface.

17. An electron beam device according to claim 13 further comprising modulation means adjacent the path of the electron beam for modulating the electron beam so that said electron beam device defines an electron beam amplifier.

18. An electron beam device comprising:

electron beam generating means for generating an electron beam;

a diamond layer positioned downstream from the electron beam and oriented so that the electron beam irradiates a first face thereof so that said diamond layer defines an electron beam target, said diamond layer having a conductance responsive to the electron beam;

a semiconducting layer comprising a degeneratively doped semiconducting material on the first face of said diamond layer; and an electrically conductive layer on a portion of said semiconducting layer defining an electrical contact therewith;

wherein said semiconducting layer is positioned in the path of the electron beam, and said electrically conductive layer defines an exposed portion of said semiconducting layer in the path of the electron beam.

19. An electron beam device according to claim 18 further comprising a second electrically conductive layer on a second face of said diamond layer opposite the first face defining a carrier flow path between said semiconducting layer and said second electrically conductive layer through said diamond layer.

20. An electron beam device according to claim 19 wherein said diamond layer comprises a plurality of side-by-side columnar diamond grains.

21. An electron beam device according to claim 19 wherein said diamond layer has a predetermined thickness substantially equal to a penetration depth of the electron beam.

22. An electron beam device according to claim 18 wherein said degeneratively doped semiconducting material comprises degeneratively doped diamond.

23. A horizontal electron beam device comprising:

a field emitter for generating an electron beam;

a diamond layer positioned in a path of the electron beam and oriented so that the electron beam irradiates a first face thereof so that said diamond layer defines an electron beam target, said diamond layer having a conductance responsive to the electron beam; and a pair of spaced apart conductive layers on said face of said diamond layer defining an exposed portion of the face of said diamond layer therebetween, said pair of conductive layers defining a carrier flow path through the diamond layer.

24. A horizontal electron beam device according to claim 23 wherein said pair of spaced apart conductive layers comprise first and second degeneratively doped surface portions of said first face of said diamond layer.

25. An electron beam device according to claim 24 wherein each of said degeneratively doped surface portions have a dopant concentration of greater than $10^{19}$ atoms per $cm^3$.

26. A horizontal electron beam device according to claim 24 wherein said first degeneratively doped surface portion comprises a predetermined conductivity type and said second degeneratively doped surface portion comprises said predetermined conductivity type.

27. A horizontal electron beam device according to claim 24 wherein said first degeneratively doped surface portion comprises a first conductivity type and said second degeneratively doped surface portion comprises a second conductivity type.

28. An electron beam device according to claim 23 wherein said field emitter comprises a diamond surface portion and a raised emitter tip with an angled surface.

29. An electron beam device according to claim 23 further comprising modulation means adjacent the path of the electron beam for modulating the electron beam so that said electron beam device defines an electron beam amplifier.

30. An electron beam device according to claim 23 wherein said diamond layer comprises a lightly doped diamond layer.

31. An electron beam device according to claim 23 wherein said diamond layer comprises doped diamond having substantially equal concentrations of n-type and p-type dopants.

32. An electron beam device according to claim 23 wherein said diamond layer comprises a plurality of side-by-side columnar diamond grains oriented with a tilt and azimuthal mis-orientation of less than about 8° such that the first face of said diamond layer approaches a single crystal morphology.

33. A vertical electron beam device comprising:

electron beam generating means for generating an electron beam;

a semiconducting diamond layer positioned in a path of the electron beam and oriented so that the electron beam irradiates a first face thereof so that said diamond layer defines an electron beam target, said semiconducting diamond layer having a conductance responsive to the electron beam;

a degeneratively doped diamond layer on the first face of said semiconducting diamond layer and positioned in the path of the electron beam;

a conductive layer on a second face of the diamond layer opposite the first face, said degeneratively doped diamond layer and said conductive layer defining a carrier flow path therebetween; and a conductive layer on a portion of said degeneratively doped diamond layer, wherein said conductive layer defines an exposed portion of said semiconducting layer in the path of the electron beam.

34. A vertical electron beam device according to claim 33 wherein said conductive layer comprises a second degeneratively doped diamond layer.

35. A vertical electron beam device according to claim 34 wherein said first degeneratively doped diamond layer comprises a first conductivity type and said second degeneratively doped diamond layer comprises a second conductivity type.

36. A vertical electron beam device according to claim 34 wherein said first degeneratively doped diamond layer comprises a predetermined conductivity type and said second degeneratively doped diamond layer comprises said predetermined conductivity type.

37. A vertical electron beam device according to claim 33 wherein a thickness of said semiconducting diamond layer and said degeneratively doped diamond layer is substantially equal to a penetration depth of the electron beam.

38. A vertical electron beam device according to claim 33 further comprising modulation means adjacent the path of the electron beam for modulating the electron beam so that said electron beam device defines an electron beam amplifier.

39. A vertical electron beam device according to claim 33 wherein said semiconducting diamond layer comprises a lightly doped diamond layer.

40. A vertical electron beam device according to claim 33 wherein said semiconducting diamond layer comprises doped diamond having substantially equal concentrations of n-type and p-type dopants.

41. A vertical electron beam device according to claim 33 wherein said degeneratively doped diamond layer comprises a diamond layer having a dopant concentration of greater than $10^{19}$ atoms per $cm^3$.

42. A vertical electron beam device according to claim 33 wherein said diamond layer comprises a plurality of side-by-side columnar diamond grains.

43. A vertical electron beam device according to claim 33 wherein said electron beam generating means comprises a field emitter having a diamond surface portion and a raised emitter tip with an angled surface.

44. An electron beam device comprising:
   a field emitter for generating an electron beam;
   a diamond layer positioned in a path of the electron beam and oriented so that the electron beam irradiates a face thereof so that said diamond layer defines an electron beam target, said diamond layer having a conductance responsive to the electron beam; and
   a pair of conductive contacts on said diamond layer defining a carrier flow path through said diamond layer;
   wherein one of said conductive contacts comprises a layer of a degeneratively doped semiconducting material on the irradiated face of said diamond layer,
   wherein said degeneratively doped semiconducting material comprises one of cubic-BN, SiC, BN, AlN, GaN, InN, a type-III nitride alloy, a semiconducting polymer and a carbon-nitride.

45. An electron beam device according to claim 44 wherein said field emitter comprises a diamond surface portion and a raised emitter tip with an angled surface.

46. An electron beam device according to claim 44 wherein said diamond layer comprises a lightly doped diamond layer.

47. An electron beam device according to claim 44 wherein said diamond layer comprises a doped diamond layer having substantially equal concentrations of n-type and p-type dopants.

48. An electron beam device according to claim 44 further comprising modulation means adjacent the path of the electron beam for modulating the electron beam so that said electron beam device defines an electron beam amplifier.

49. An electron beam device comprising:
   a field emitter for generating an electron beam;
   a diamond layer positioned in a path of the electron beam and oriented so that the electron beam irradiates a face thereof so that said diamond layer defines an electron beam target, said diamond layer having a conductance responsive to the electron beam; and
   a pair of conductive contacts on said diamond layer defining a carrier flow path through said diamond layer;
   wherein one of said conductive contacts comprises a layer of a degeneratively doped semiconducting material on the irradiated face of said diamond layer,
   wherein at least a portion of said degeneratively doped semiconducting layer is positioned in the path of the electron beam, and wherein said conductive contact further comprises an electrically conductive layer on a portion of said degeneratively doped semiconducting layer defining an exposed portion of said semiconducting layer in the path of the electron beam.

50. An electron beam device according to claim 49 wherein said degeneratively doped semiconducting material comprises degeneratively doped diamond.

51. A method for making a diamond electron beam device comprising the steps of:
   providing a diamond layer having a face, said diamond layer having a conductance responsive to an electron beam irradiating said diamond layer;
   forming a sacrificial layer over a portion of said diamond layer;
   forming a field emitter on said sacrificial layer opposite said diamond layer;
   forming an insulating diamond layer over said field emitter and said sacrificial layer, said insulating diamond layer extending over said sacrificial layer to said diamond layer; and
   selectively removing said sacrificial layer.

52. A method according to claim 51 further comprising the step of forming a degeneratively doped surface portion on the face of said diamond layer.

53. A method according to claim 51 further comprising the step of providing a conductive layer on said diamond layer opposite said sacrificial layer.

54. A method for making a diamond electron beam device comprising the steps of:
   ion implanting a surface of a first diamond layer to produce crystal damage below the surface of said first diamond layer;
   forming a second diamond layer on said surface of said first diamond layer;
   doping a surface of said second diamond layer opposite said first diamond layer;
   removing said second diamond layer from said first diamond layer; and
   assembling said second diamond layer together with an electron beam source so as to define a diamond electron beam device.

* * * * *